(12) United States Patent
Namiki et al.

(10) Patent No.: US 6,818,310 B2
(45) Date of Patent: Nov. 16, 2004

(54) SILICON OXIDE FILM

(75) Inventors: Tsunehisa Namiki, Yokohama (JP); Toshihide Ieki, Yokohama (JP); Hideo Kurashima, Yokohama (JP); Hajime Inagaki, Yokohama (JP); Akira Kobayashi, Yokohama (JP); Koji Yamada, Yokohama (JP); Miwako Tanikawa, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 0 days.

(21) Appl. No.: 10/332,135

(22) PCT Filed: May 13, 2002

(86) PCT No.: PCT/JP02/04616

§ 371 (c)(1),
(2), (4) Date: Jan. 6, 2003

(87) PCT Pub. No.: WO02/092875

PCT Pub. Date: Nov. 21, 2002

(65) Prior Publication Data

US 2003/0165696 A1 Sep. 4, 2003

(30) Foreign Application Priority Data

| May 11, 2001 | (JP) | ..................................... 2001-142405 |
|---|---|---|
| Feb. 19, 2002 | (JP) | ..................................... 2002-042034 |
| May 7, 2002 | (JP) | ..................................... 2002-131424 |

(51) Int. Cl.[7] ............................. B32B 27/28; B32B 9/00
(52) U.S. Cl. ....................... 428/446; 428/336; 428/448; 428/451
(58) Field of Search ................................. 428/446, 336, 428/448, 451; 427/255.27, 255.28, 255.37

(56) References Cited

U.S. PATENT DOCUMENTS

| 5,494,712 A | * | 2/1996 | Hu et al. ..................... 427/489 |
|---|---|---|---|
| 5,616,369 A | * | 4/1997 | Williams et al. ............ 427/536 |
| 5,725,958 A | * | 3/1998 | Matsuda et al. ............ 428/446 |
| 6,054,188 A | * | 4/2000 | Tropsha et al. ............. 427/488 |
| 6,254,983 B1 | * | 7/2001 | Namiki ....................... 428/336 |
| 6,517,911 B1 | * | 2/2003 | Matsuki ...................... 427/551 |
| 6,586,346 B1 | * | 7/2003 | Yamazaki et al. .......... 438/774 |

FOREIGN PATENT DOCUMENTS

| JP | 7-304127 | 11/1995 | |
|---|---|---|---|
| JP | 07304127 A | * 11/1995 | ............ B32B/9/00 |
| JP | 2526766 | 6/1996 | |
| JP | 11-256339 | 9/1999 | |
| JP | 11-309815 | 11/1999 | |

OTHER PUBLICATIONS

Tsunehisa Namiki. "Koshuha Plasma CVD Ho ni yotte Keisei sareta SiOx Maku no Gas Shadansei," *The Food Industry.* Feb. 28, 1996, vol. 39, No. 4, pp. 43–49.

International Search Report of PCT/JP02/04616 dated Aug. 27, 2002.

* cited by examiner

*Primary Examiner*—Stephen Stein
(74) *Attorney, Agent, or Firm*—Sughrue Mion, PLLC

(57) ABSTRACT

A silicon oxide film is formed on the surfaces of a plastic substrate and contains methyl groups and methylene groups in a portion near the interface to the plastic substrate. The silicon oxide film exhibits not only excellent adhesion to the plastic substrate, softness and flexibility but also exhibits excellent gas shut-off property (gas barrier property), makes it possible to achieve excellent gas-shutoff property with a smaller film thickness than that of the conventional films, and can be mass-produced favorably.

13 Claims, 11 Drawing Sheets

SCHEMATIC DIAGRAM OF AN APPARATUS FOR TREATMENT WITH A NICROWAVE PLASMA

SILICON OXIDE FILM

TECHNICAL FIELD TO WHICH THE INVENTION BELONGS

The present invention relates to a silicon oxide film formed on the surfaces of a plastic substrate. More specifically, the invention relates to a silicon oxide film which has excellent gas shut-off property and is useful in a field of packing materials.

PRIOR ART

As packing containers, there have heretofore been used metal cans, glass bottles and a variety of plastic containers. Among them, plastic containers have such advantages that they are light in weight and are excellent in shock resistance to some extent accompanied, however, by such problems as permitting the contents to be degenerated and flavor to be decreased due to oxygen that permeates through the container walls.

In metal cans and glass bottles, in particular, no oxygen permeates through the container wall, and what causes a problem is only the oxygen remaining in the containers. In the case of plastic containers, on the other hand, oxygen permeates through the container walls to a degree that is no longer negligible arousing a problem from the standpoint of preserving the contents.

In order to prevent this, there has been proposed a plastic container having a container wall of a multi-layer structure at least one of the layers being formed of an oxygen-blocking resin such as an ethylene/vinyl alcohol copolymer.

However, a multi-layer plastic container requires a technology such as co-extrusion or co-injection of a plurality of resins, a cumbersome formation operation as compared to forming a single-layer resin container, accompanied by a problem of low productivity.

It has also been known already to improve the gas shut-off property by forming a film by vapor deposition on a plastic material of a single layer, and to form a silicon oxide film (SiOx) as well as to form a hard carbon film (DLC).

Japanese Unexamined Utility Model Publication (Kokai) No. 50563/1974 and Japanese Unexamined Patent Publication (Kokai) No. 58171/1974 are teaching silicon oxide films by coating a plastic film based on a physical vaporization method (PVD).

Further, Japanese Unexamined Patent Publication (Kokai) No. 345383/1993 teaches a silicon oxide film formed by the chemical vaporization method (CVD).

Japanese Patent No. 2526766 filed by the present applicant discloses a gas-blocking laminated plastic material comprising a plastic member, a first layer of a polymer formed thereon and containing not less than 15% of silicon, not less than 20% of carbon and the remainder of oxygen, and a second layer of a silicon oxide film formed on the first layer.

However, the conventional silicon oxide film must have a considerably large thickness to impart the required gas shut-off property. Besides, the coated film lacks adhesion to the plastic substrate, softness and flexibility. When, for example, the plastic substrate coated with the above film is drawn, the film is subject to be broken. The productivity is poor, either.

In particular, the silicon oxide film formed by the physical vaporization method (PVD) has inferior oxygen gas shut-off property as compared on the basis of the same film thickness. To achieve the gas shut-off property of the same level, therefore, the film must be formed maintaining a considerably large thickness.

DISCLOSURE OF THE INVENTION

It is therefore an object of the present invention to provide a silicon oxide film having particularly excellent gas shut-off property (gas barrier property), capable of excellently shutting off gases with a small film thickness as compared to the conventional films, the film that is deposited exhibiting excellent adhesion to the plastic substrate, softness and flexibility, lending itself well for being excellently produced.

According to the present invention, there is provided a silicon oxide film formed on the surfaces of a plastic substrate, wherein methyl groups and methylene groups are contained in the silicon oxide film in a portion near the interface to the plastic substrate.

The fact that the methyl groups and the methylenes group are existing in the silicon oxide film of the invention in a portion close to the interface to the plastic substrate, can be confirmed by, for example, depositing an Al film on the surface of the silicon oxide film formed on the surface of the plastic substrate, eluting the plastic substrate by using an organic solvent such as hexafluoroisopropanol or the like, and measuring a first infrared absorption spectrum of the surface of the remaining silicon oxide film. That is, in the first infrared absorption spectrum, an infrared absorption peak due to the methyl group and an infrared absorption peak due to the methylene group appear in a region of wave numbers of from 2800 to 3000 $cm^{-1}$. These peaks make it possible to confirm the presence of the methyl groups and methylene groups. Further, the first infrared absorption spectrum contains an infrared absorption peak due to SiO in a region of wave numbers of from 1000 to 1300 $cm^{-1}$ and, particularly, near 1200 $cm^{-1}$.

By using a secondary ion mass analyzer (SIMS), further, distributions of $SiCH_2$ ions and $SiCH_3$ ions in the film from the outer surface of the silicon oxide film toward the surface of the substrate are measured to make sure the positions where the $SiCH_2$ ions and $SiCH_3$ ions due to an organosilicon compound polymer are present, from which it is obvious that they are not existing on the outer surface of the film but are existing near the interface to the plastic substrate.

That is, in the silicon oxide film of the present invention, the organic groups (methyl groups and methylene groups) are existing near the interface to the plastic substrate accounting for excellent adhesion to the plastic substrate and flexibility. Even when the plastic substrate is intensely drawn, therefore, the film is effectively prevented from being broken.

In the present invention, further, the silicon oxide film has a two-layer structure comprising a first layer positioned on the side of the interface to the plastic substrate and a second layer on the first layer (i.e., layer positioned on the front surface side of the film). The methyl groups and the methylene groups are more distributed in the first layer than in the second layer. It is desired that the methyl groups and the methylene groups are not substantially contained in the second layer.

In the second infrared absorption spectrum of the silicon oxide film of the invention, for example, it is desired that an absorption peak exists in a region of wave numbers of from 1215 to 1250 $cm^{-1}$. The second infrared absorption spectrum is measured by the multiplex reflection differential spectral method from the film surface (surface of the second layer). The above first infrared absorption spectrum chiefly represents infrared absorption characteristics of the first layer positioned near the interface to the plastic substrate while the second infrared absorption spectrum chiefly represents infrared absorption characteristics of the second layer.

That is, owing to the above-mentioned two-layer structure, the silicon oxide film of the present invention exhibits excellent gas shut-off property.

In the second infrared absorption spectrum of the silicon oxide film, further, it is desired that the absorbency ratio defined by the following formula (1), $$Ri = A_1/A_2 \times 100 \quad (1)$$

wherein $A_1$ is an area of an absorbency of wave numbers over a range of from 1215 to 1250 cm$^{-1}$, and $A_2$ is an area of an absorbency of wave numbers over a range of from 985 to 1250 cm$^{-1}$, is not smaller than 1%.

In the second infrared absorption spectrum of the silicon oxide film of the present invention, further, it is desired that the infrared absorbency ratio of SiOH/SiO is not larger than 0.25.

It is desired that the silicon oxide film of the present invention has a silicon distribution coefficient represented by a ratio of the silicon content and the film thickness (silicon content/thickness) of 0.3 g/cm$^3$, has an oxygen permeation coefficient of not larger than 0.5×10$^{-16}$ cc·cm/cm$^2$/sec/cmHg (30° C.) and, further, has a 10-point average surface roughness (Rz) of smaller than 25 nm and a center line average roughness (Ra) of smaller than 10 nm.

The silicon oxide film of the present invention having the above properties can be produced by a plasma CVD method and, usually, has a thickness of as very small as from 2 to 500 nm yet exhibiting excellent gas shut-off property.

According to the present invention, further, there is provided a gas-blocking plastic material having an inner layer and an outer layer of a thermoplastic resin, and an oxygen-absorbing layer between the inner layer and the outer layer, wherein the above silicon oxide film is formed on the surface of the inner layer and/or on the surface of the outer layer.

That is, upon forming the silicon oxide film on the inner surface and/or on the outer surface of the plastic substrate having the oxygen-absorbing layer as described above, there are imparted oxygen shut-off effect due to the oxygen-absorbing layer as well as gas shut-off property due to the silicon oxide film, making it possible to strikingly improve the gas shut-off property.

BEST MODE FOR CARRYING OUT THE INVENTION

The silicon oxide film of the present invention has an important feature in that methyl groups and methylene groups are existing near the interface to the plastic substrate.

Figure 1:
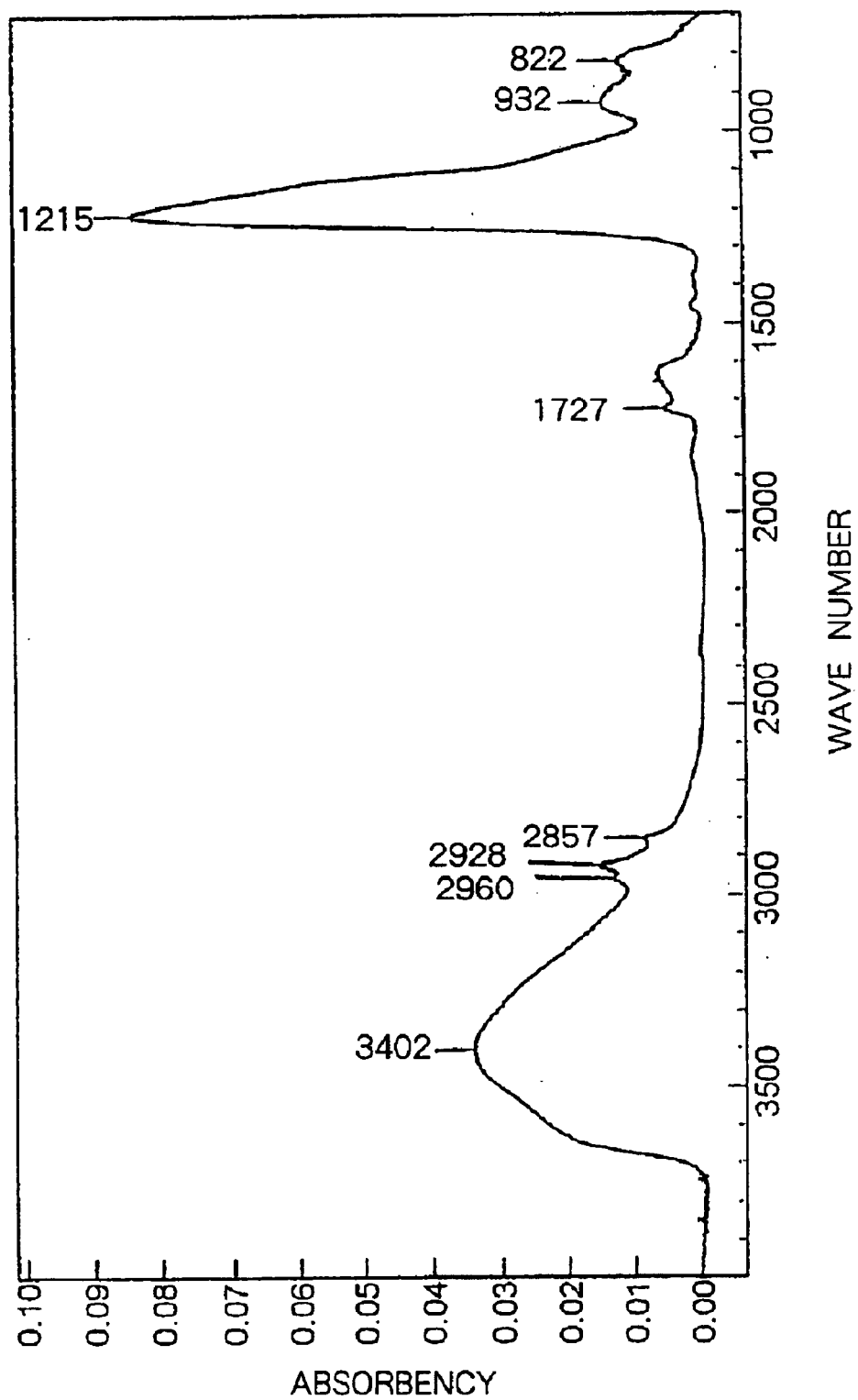
FIG. 1 is a diagram illustrating a first IR spectrum of a silicon oxide film of the invention prepared according to Example 1 as measured from the side of the plastic substrate (PET bottle)

That is, referring to FIG. 1 illustrating the first infrared absorption spectrum of the silicon oxide film of the present invention of a portion near the interface to the plastic substrate, the silicon oxide film being prepared according to Example 1 appearing later, there are recognized infrared absorption peaks due to the methyl group and an infrared absorption peak due to the methylene group in a region of wave numbers of from 2800 to 3000 cm$^{-1}$ (in FIG. 1, peaks at 2857 cm$^{-1}$ and 2960 cm$^{-1}$ are those due to the methyl group (CH$_3$), and a peak at 2928 cm$^{-1}$ lying therebetween is the one due to the methylene group (CH$_2$)).

Further, the spectrum of FIG. 1 indicates a peak due to SiO (siloxane) in a region of wave numbers of from 1000 to 1300 cm$^{-1}$ and, particularly, near 1200 cm$^{-1}$.

This fact tells that the silicon oxide film of the present invention contains a silicon oxide as well as a polymer of an organosilicon compound near the interface to the plastic substrate. That is, due to the presence of the polymer component near the interface to the plastic substrate, the silicon oxide film is highly soft and flexible exhibiting excellent adhesion to the plastic substrate. As a result, excellent gas shut-off property is exhibited despite the film has a very small thickness.

In this invention, the portion of the silicon oxide film near the interface to the plastic substrate varies depending upon the thickness of the film and cannot be definitely stated. Usually, however, this portion lies in a range of not larger than 10 nm from the surface of the plastic substrate.

It is further desired that the silicon oxide film of the present invention has a two-layer distribution structure.

When divided into the first layer located on the side of the interface to the plastic substrate and the second layer on the first layer (i.e., layer located on the surface of the side opposite to the interface to the plastic substrate), the methyl groups and the methylene groups are distributed in large amounts in the first layer, but are distributed in small amounts or are not distributed in the second layer.

That is, the gas barrier property is improved owing to the two-layer distribution structure in which the methyl groups and the methylene groups are mainly distributed in the first layer. For example, if the methyl groups and methylene groups are much distributed in the second layer, too, the gas barrier property tends to be deteriorated.

The above two-layer distribution structure of the silicon oxide film of the present invention can be confirmed even by the SIMS (secondary ion mass spectrum) or the X-ray electron spectral analysis.

Figure 3:
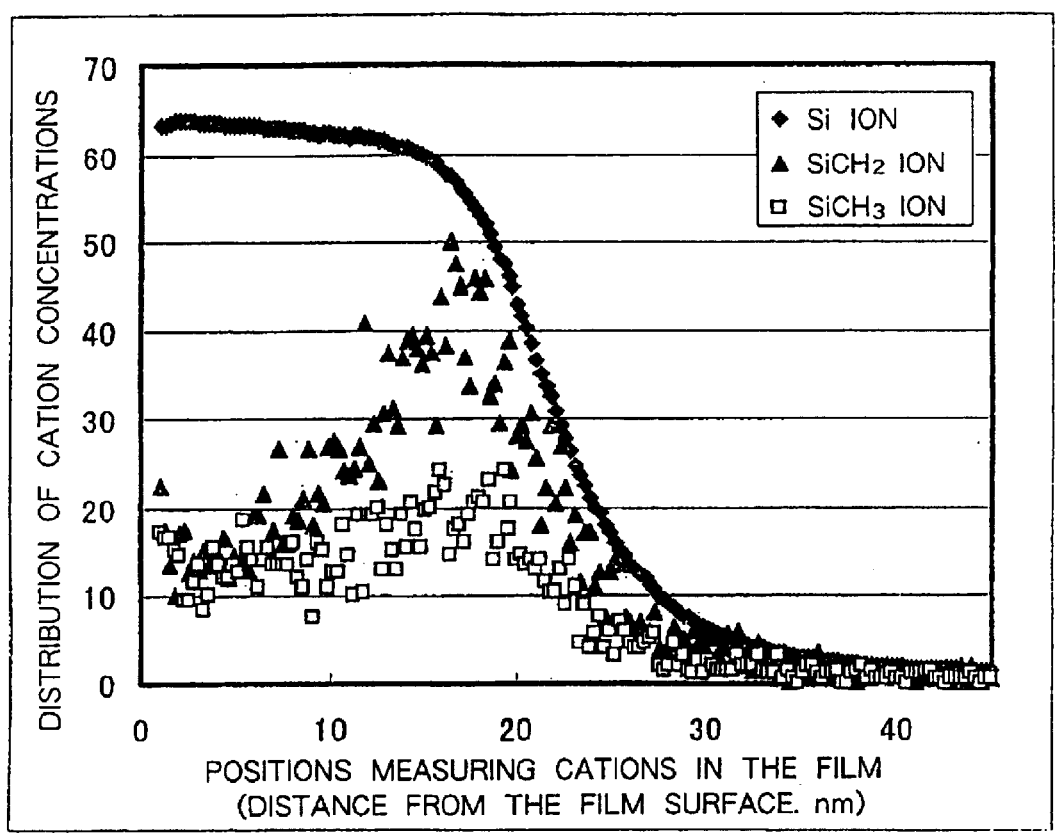
FIG. 3 is a diagram illustrating the distribution of ion concentrations in the silicon oxide film of the invention prepared according to Example 1 as measured by the SIMS.

FIG. 3 is a diagram illustrating the distribution of ion concentrations in the silicon oxide film prepared according to Example 1 as measured by the SIMS. According to FIG. 3, the peaks of $SiCH_3$ ion and $SiCH_2$ ion distributions are deviated toward near the interface to the plastic substrate (PET bottle), and these ions are not almost distributed in the surface of the film. Further, the Si ions are sharply decreasing near the interface to the plastic substrate.

Figure 4:
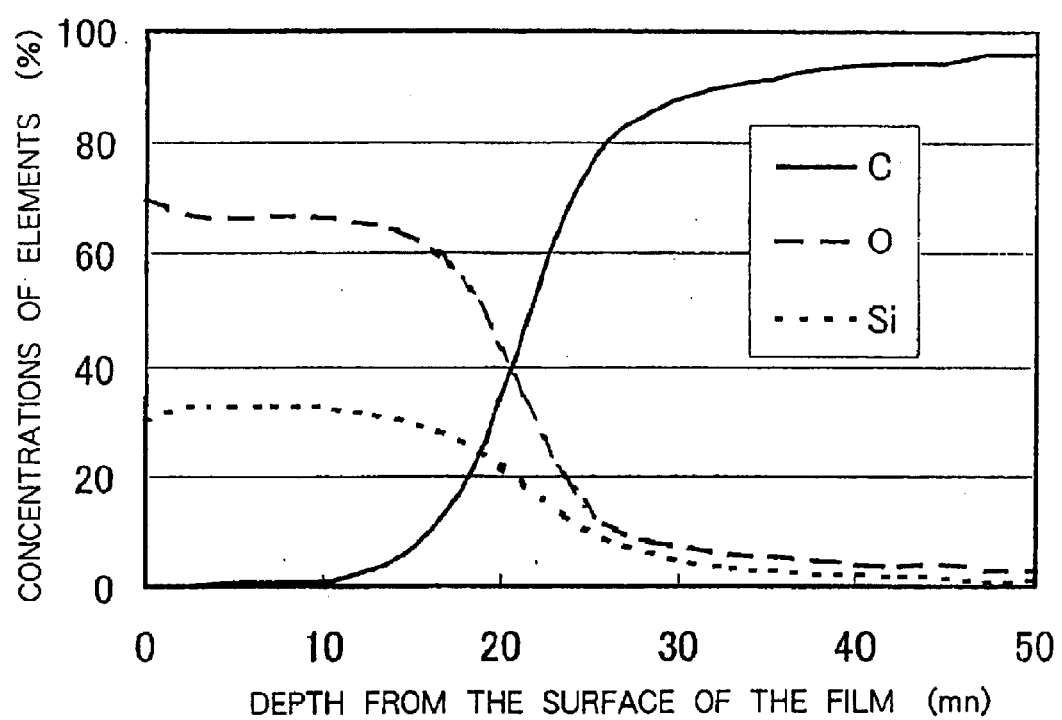
FIG. 4 is a chart of an X-ray photoelectron spectral analysis of the silicon oxide film of the invention prepared according to Example 1.

FIG. 4 is a chart of an X-ray photoelectron spectral analysis of the silicon oxide film prepared according to Example 1. According to FIG. 4, the concentrations of silicon (Si) and oxygen (O) are gradually decreasing near the interface to the plastic substrate while the concentration of carbon (C) is sharply increasing near the interface to the plastic substrate. That is, it is confirmed that the film has, on the front surface side thereof, a second layer in which no carbon (C) is substantially existing, and has, near the interface to the plastic substrate, a layer in which silicon (Si) is existing at a concentration of not lower than 15% and carbon (C) is existing at a concentration of not lower than 20%.

Figure 5:
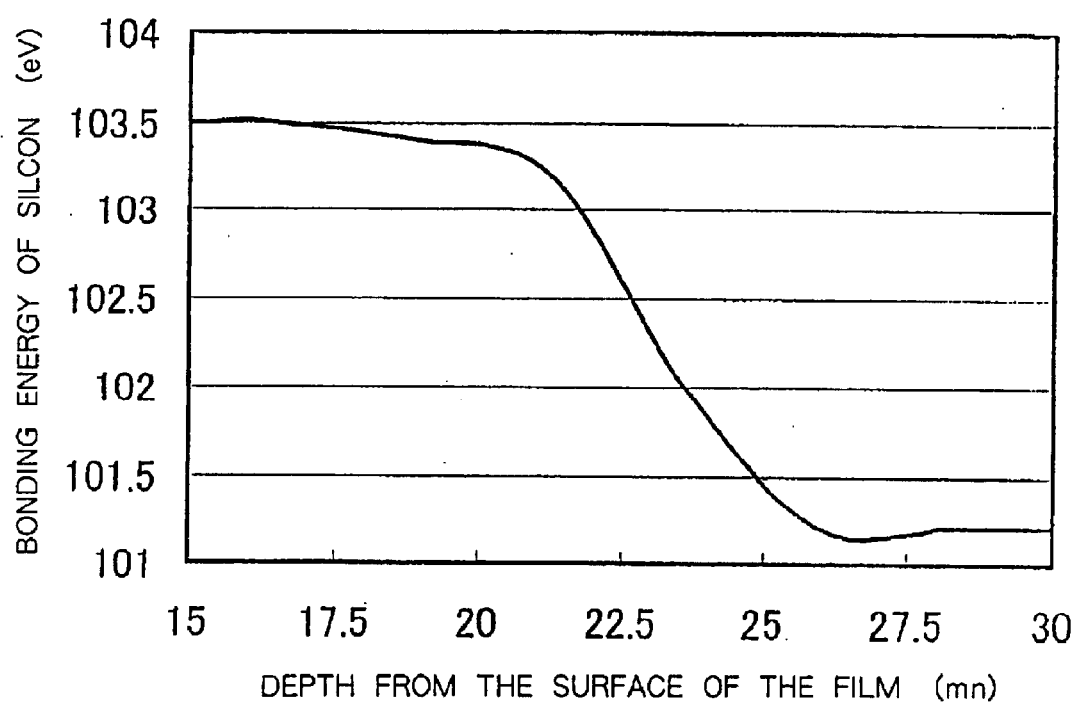
FIG. 5 is a diagram illustrating the distribution of bonding energy of silicon in the silicon oxide film of the invention prepared according to Example 1 in the direction of substrate from the outer surface of the film as measured by the X-ray photoelectron spectral analysis.

FIG. 5 is a diagram illustrating the distribution of bonding energy of silicon in the silicon oxide film prepared according to Example 1 in the direction of substrate from the outer surface of the film as measured by the X-ray photoelectron spectral analysis. It is confirmed from FIG. 5 that the bonding energy of silicon on the outer surface of the silicon oxide film is near 103.5 eV due to the SiO bond, and the bonding energy of the layer containing not less than 15% of silicon and not less than 20% of oxygen is changing to near 102.5 eV due to the Si(R)—C bond (R is an alkyl group) manifesting that this layer is an organosilicon polymer layer.

It will thus be comprehended that the silicon oxide film of the present invention has a two-layer distribution structure having an organosilicon polymer layer as a first layer near the interface to the plastic substrate and a second layer on the surface thereof without almost containing the organosilicon polymer component but containing a silicon oxide at a very high density.

Figure 2:
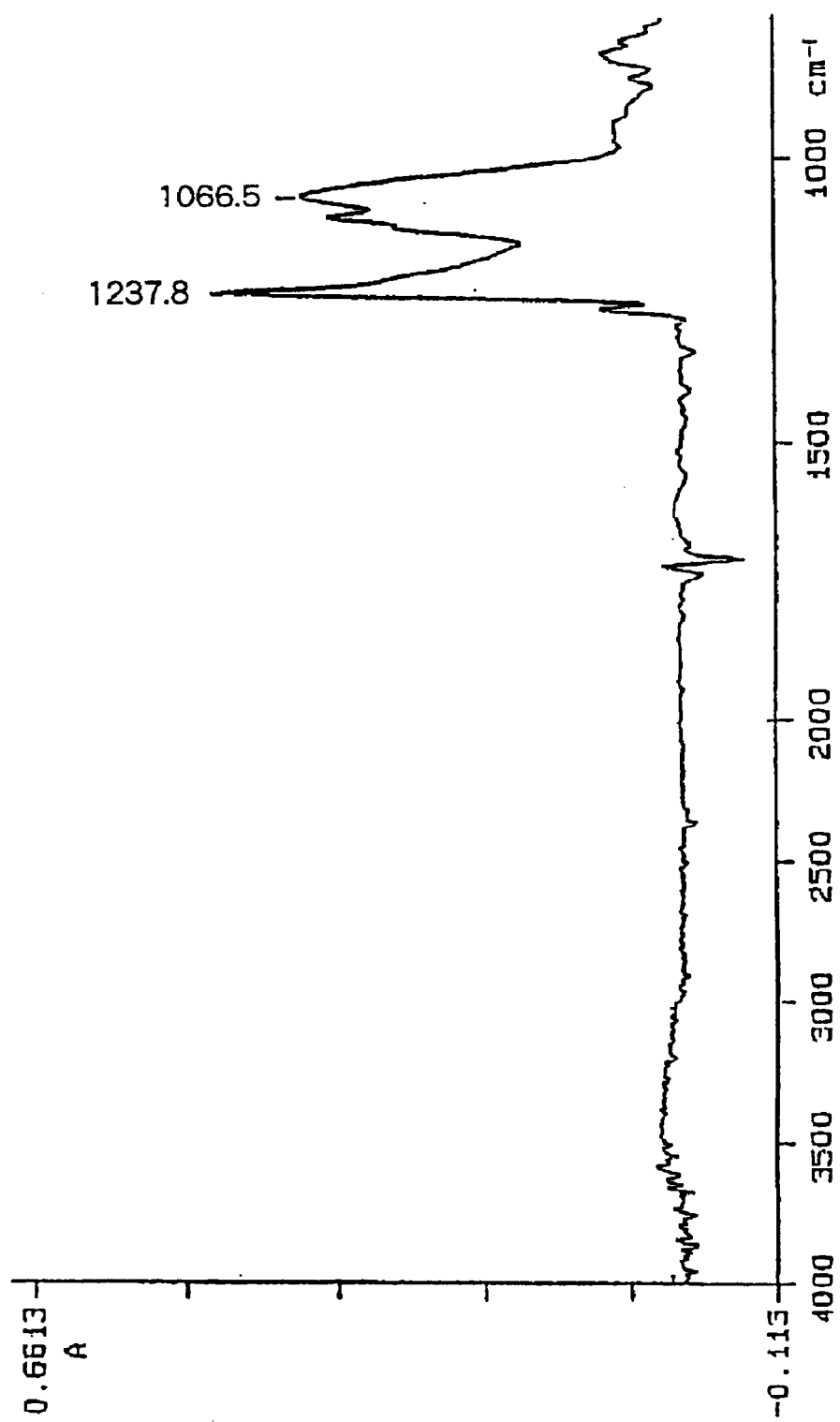
FIG. 2 is a diagram illustrating a second IR spectrum of the silicon oxide film of the invention prepared according to Example 1 as measured from the side of the surface thereof (surface of the side opposite to the interface to the plastic substrate)

In the present invention as shown in FIG. 2, further, absorption peaks are existing in a region of wave numbers of from 1215 to 1250 cm$^{-1}$ in the second infrared absorption spectrum of the silicon oxide film obtained by the multiplex refraction differential spectral method. Like the peak near 1200 cm$^{-1}$ in the first infrared absorption spectrum, the above absorption peaks are locked and stem from a dense SiO. It is considered that such a dense SiO bond is formed in the silicon oxide film of the present invention probably because a silanol group is formed and is dehydrated in the step of forming the film as represented by the following formula,

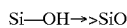

Si—OH→>SiO

In the second infrared absorption spectrum (see FIG. 2) of the silicon oxide film of the invention, further, it is desired that the absorbency ratio (Ri) as defined by the following formula (1), $$Ri=A_1/A_2\times100 \qquad (1)$$

wherein $A_1$ is an area of an absorbency of wave numbers over a range of from 1215 to 1250 cm$^{-1}$, and $A_2$ is an area of an absorbency of wave numbers over a range of from 985 to 1250 cm$^{-1}$, is not smaller than 1%. The absorbency ratio (Ri) which is not smaller than 1% means that vivid peaks exist in a region of wave numbers of from 1215 to 1250 cm$^{-1}$, and a dense SiOx exists in larger amounts as $A_1$ increases exhibiting excellent gas shut-off property. When the absorbency ratio (Ri) is smaller than 1%, the gas barrier property may decrease.

Figure 8:
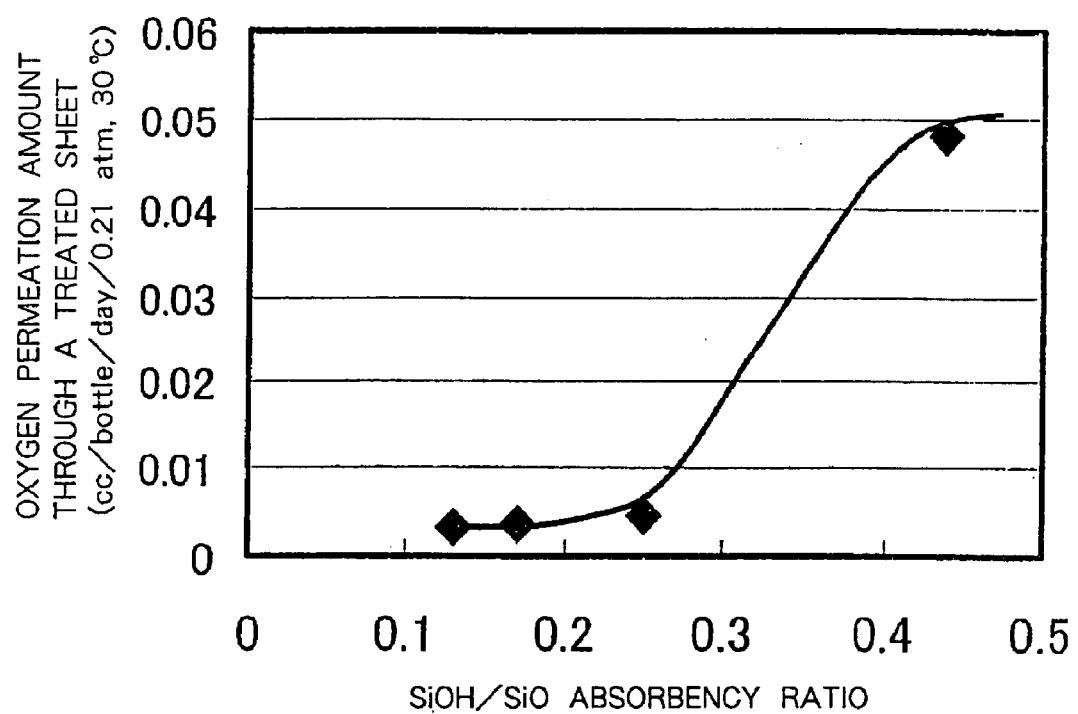
FIG. 8 is a diagram plotting a relationship between the SiOH/SiO absorbency ratio (A) along the abscissa and the oxygen permeation amount along the ordinate of various silicon oxide films formed on the surface of the plastic substrate (PET bottle)

In the second infrared absorption spectrum of the silicon oxide film obtained by the multiplex reflection differential spectral method of FIG. 2, further, it is desired that the infrared absorbency ratio (A) of SiOH/AiO is not larger than 0.25. That is, in FIG. 2, the infrared absorption peak of SiOH is appearing over the wave numbers of from 910 to 950 cm$^{-1}$ and the infrared absorption peak of SiO (siloxane) is appearing over 1020 to 1080 cm$^{-1}$. When the peak ratio is not larger than 0.25, the film exhibits markedly improved oxygen gas shut-off property. FIG. 8 is a diagram plotting a relationship between the infrared absorbency ratio (A) of the second layer along the abscissa and the oxygen permeation amount along the ordinate of various silicon oxide films formed on the PET bottle. According to FIG. 8, the oxygen permeation amount monotonously increases with an increase in the infrared absorbency ratio (A) of SiOH/SiO (i.e., with an increase in the amount of SiOH). There exists a point of inflection at where the absorbency ratio (A) is about 0.25. In a region not higher than this point, the oxygen gas shut-off property can be markedly improved.

Being related to that the silicon oxide film of the present invention has the above two-layer distribution structure, the silicon distribution coefficient represented by a ratio of the silicon content in the film/thickness of the film is not smaller than 0.3 g/cm$^3$ and that the oxygen permeation coefficient is not larger than 0.5×10$^{-16}$ cc·cm/cm$^2$/sec/cmHg (30° C.). That is, the silicon oxide film has a thickness which is usually as very small as from 2 to 500 nm, and exhibits very excellent gas shut-off property owing to the characteristics of the above two-layer distribution structure. By utilizing the formula of gas permeation related to the laminate, the oxygen permeation coefficient of the silicon oxide film is found as follows:

$$t/P=t_1/P_1+t_2/P_2$$

wherein, t is a resultant thickness (cm) of the plastic substrate and of the silicon oxide film, P is an oxygen permeation coefficient of a laminate of the plastic substrate and the silicon oxide film (cc·cm/cm$^2$/sec/cmHg,)

$t_1$ is a thickness of the silicon oxide film, $P_1$ is an oxygen permeation coefficient of the silicon oxide film, $t_2$ is a thickness of the plastic substrate, and $P_2$ is an oxygen permeation coefficient of the plastic substrate.

Figure 9:
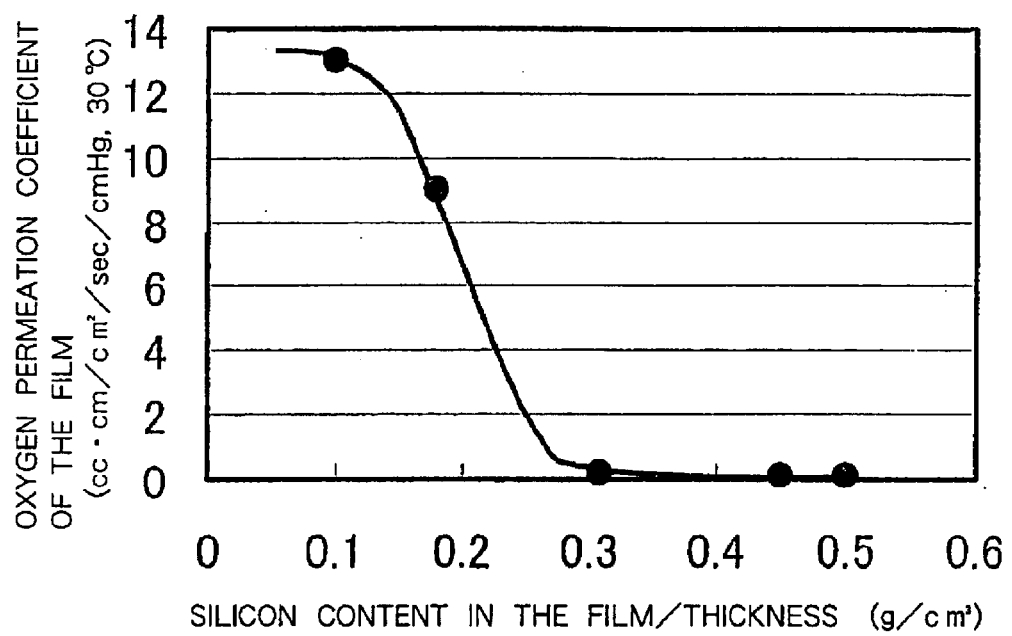
FIG. 9 is a diagram illustrating a relationship between the silicon distribution coefficient (ratio of the silicon content in the film and the film thickness) and the oxygen permeation coefficient of various silicon oxide films formed on the surface of the plastic substrate (biaxially drawn PET sheet)

FIG. 9 is a diagram illustrating a relationship between the silicon distribution coefficient (ratio of the silicon content in the film and the film thickness) and the oxygen permeation coefficient of various silicon oxide films having the two-layer distribution structure. According to FIG. 9, it will be learned that the oxygen permeation coefficient sharply decreases as the silicon distribution coefficient exceeds 0.3 g/cm$^3$ to exhibit a very high oxygen barrier property. That is, the silicon oxide film of the present invention has a silicon distribution coefficient, which represents the silicon amount per a unit thickness, of at least not smaller than 0.3 g/cm$^3$. As a result, the gas shut-off property is low. The oxygen permeation coefficient is not larger than, for example, 0.5× 10$^{-16}$ cc·cm/cm$^2$/sec/cmHg (30° C.). Therefore, the silicon oxide film of the invention exhibits excellent oxygen barrier property despite of its very small thickness.

It is desired that the silicon oxide film of the present invention has a 10-point average roughness (Rz) of smaller than 25 nm and a center line average roughness (Ra) of smaller than 10 nm from the standpoint of gas shut-off property. These surface roughnesses (10-point average roughness Rz and center line average roughness Ra) are measured in compliance with the JIS B0601.

The silicon oxide film is very thin and, hence, its surface roughness seriously affects the gas shut-off property. That is, when the surface roughness becomes greater than a certain level, the effect of the gas permeating through valley portions of the roughness becomes so great that the gas shut-off property of the silicon oxide film as a whole decreases.

According to the study conducted by the present inventors, the effect of gas permeation due to surface roughness can be neglected if the 10-point average roughness (Rz) is smaller than 25 nm and the center line average roughness (Ra) is smaller than 10 nm though the value of the surface roughness itself differs to a considerable degree depending upon the definition thereof.

(Formation of the Silicon Oxide Film)

The above silicon oxide film of the present invention is formed by a chemical vapor deposition method (CVD) and, particularly, by a plasma CVD method. That is, the silicon oxide film is formed on the surface of the plastic substrate by the plasma CVD method in an atmosphere containing an organosilicon compound, oxygen and a carrier gas.

The plasma CVD is for forming a thin film by utilizing a gas plasma. Basically, the plasma CVD is a process in which a gas containing a starting gas is decomposed by an electric discharge of electric energy in a high electric field under a reduced pressure, and the substance that is formed is deposited on a substrate in a gaseous phase or through a chemical reaction on the substrate.

The state of a plasma is realized by the glow discharge. Depending upon the manner of glow discharge, there can be conducted a method that utilizes a DC glow discharge, a method that utilizes a high-frequency glow discharge or a method that utilizes a microwave discharge.

The low-temperature plasma CVD has such advantages as:

① the starting gas having a large energy of formation can be easily dissociated since the gaseous molecules are directly decomposed by high-speed electrons;

② the temperature of electrons is different from the temperature of gaseous ions, the temperature of electrons being high having energy necessary for executing the chemical reaction while the temperature of ions being low and lying in a thermally non-equilibrium state enabling the process to be conducted at a low temperature; and ③ a relatively homogeneous amorphous film can be formed despite the substrate temperature is low; and can, hence, be easily applied even to the plastic substrates.

There has been known, for example, a physical vapor deposition method (PCD) in contrast with the chemical vapor deposition method (CVD). According to the physical vapor deposition method (PVD), a substance to be deposited is deposited on the substrate without substantially accompanied by a chemical change. The silicon oxide film formed by the physical vapor deposition method (PVD), however, has a large gas permeation coefficient and must be formed maintaining an increased thickness to impart the gas shut-off property. Besides, oxygen tends to permeate in increased amounts as the film is broken due to the working such as drawing. Further, since the PVD method involves no chemical change, it is not allowed to form the first layer containing methyl groups and methylene groups and, hence, it is not allowed to form the silicon oxide film of the present invention.

To form the silicon oxide film of the present invention, further, the plasma is generated by the glow discharge of a relatively small output. The output varies depending upon the film-forming conditions such as the kind and concentration of the starting gas, and cannot be definitely stated. In general, however, the glow discharge is conducted maintaining an output over a range of from several watts to 150 watts. Namely, the plastic substrate to be treated is placed in a predetermined processing chamber, an organosilicon compound, an oxidizing gas such as oxygen and a carrier gas are introduced into the processing chamber, and a predetermined high-frequency or microwave discharge power is applied thereto to conduct the glow discharge. The glow discharge starts with a low power which is, then, increased to be as relatively large as 200 W to 900 W to form the film, thereby to form a two-layer film.

From various experimental results, the present inventors consider that the silicon oxide film is formed through the following reaction paths:

(a) pull-out of hydrogen: $SiCH_3 \rightarrow SiCH_2$.

(b) oxidation: $SiCH_2. \rightarrow SiOH$ (c) condensation: $SiOH \rightarrow SiO$ Namely, it is considered that the silicon oxide film has so far been formed by the glow discharge of a large discharge output permitting the organic silicon compound to be reacted up to the step (c) at one time. Therefore, there is not obtained the silicon oxide film of the present invention having a two-layer structure containing the methyl groups and methylene groups in the first layer near the interface to the plastic substrate, but the silicon oxide film that is obtained exhibits poor gas shut-off property.

In the present invention, on the other hand, the glow discharge start with a low output which is, then, relatively increased for forming the film. Therefore, the organosilicon compound deposited on the surface of the plastic substrate gradually undergoes the reaction from the step (a) up to the step (c). Namely, $SiCH_2$. radicals formed in the step (a) undergo the reaction, the organosilicon compound polymer is formed near the interface to the plastic substrate and, hence, the methyl groups and methylene groups due to the above polymer are made present in the first layer close to the surface of the plastic substrate. Further, since the film is formed with a relatively large output, the reaction (c) chiefly takes place and, hence, it is believed that there is formed a film of a high silicon oxide density exhibiting excellent gas shut-off property. When the electric power is too small, an extended period of processing time is required for forming the film whereby the productivity decreases, the amount of SiOH increases in the second layer, the infrared absorbency ratio (A) of SiOH/SiO may become greater than 0.25, and the oxygen permeability increases. It is therefore desired that the film is formed by the glow discharge of an output of at least not smaller than 150 W.

(Apparatus for Treatment)

In the present invention, the apparatus used for forming the silicon oxide film includes a plasma treatment chamber in which a substrate to be treated is placed, an exhaust system for maintaining the plasma treatment chamber under a reduced pressure condition, a treatment gas introduction system for introducing a treatment gas into the plasma treatment chamber, and an electromagnetic wave introduction system for generating a plasma in the plasma treatment chamber.

Figure 10:
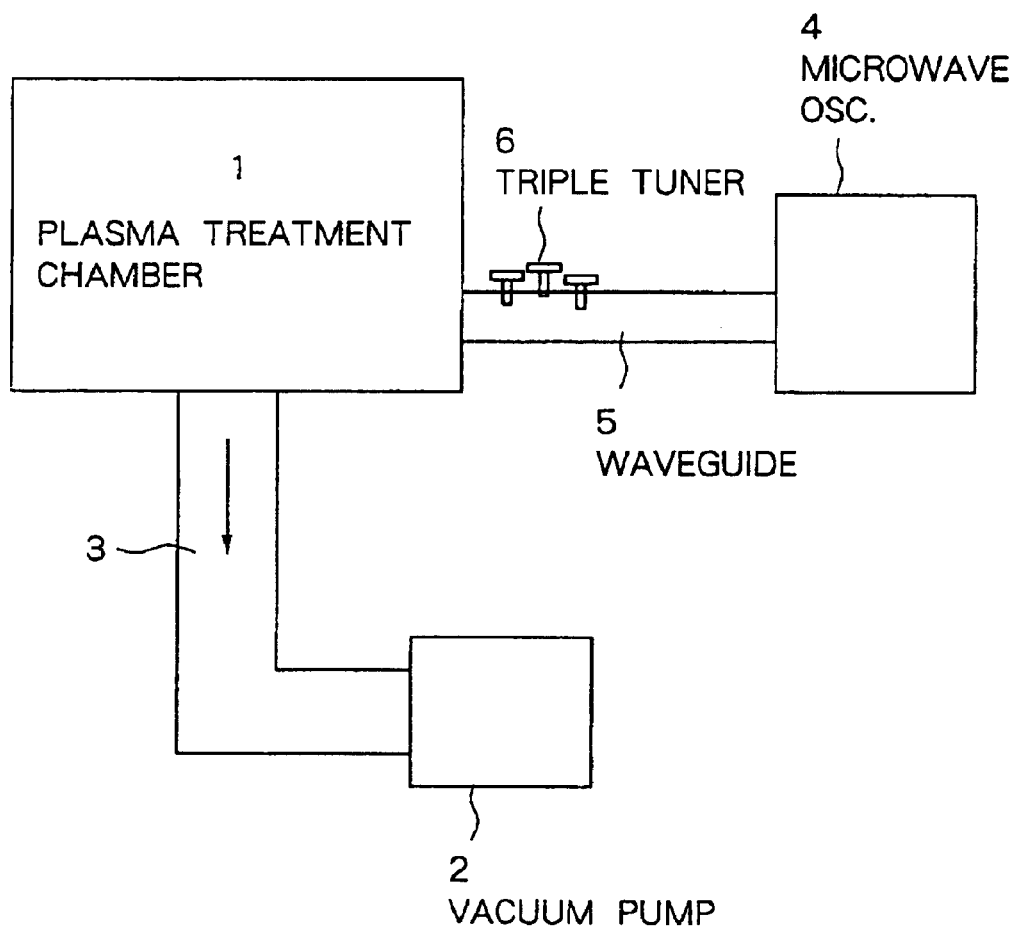
FIG. 10 is a diagram schematically illustrating the arrangement of an apparatus for treatment with a microwave plasma used for forming the silicon oxide film of the invention.

As an example of the above apparatus, FIG. 10 schematically illustrates the arrangement of an apparatus for treatment with a microwave plasma.

In FIG. 10, a vacuum pump 2 is connected to a plasma treatment chamber which as a whole is designated at 1 through an exhaust pipe 3 to maintain the treatment chamber 1 under a reduced pressure, and, further, a microwave oscillator 4 is connected thereto through a waveguide 5.

In this embodiment, the waveguie 5 is provided with a triple tuner 6 for minimizing the amount of microwaves reflected from the treatment chamber, and the plasma treatment chamber 1 is provided with a short plunger (not shown) for adjusting the load for the treatment chamber.

Figure 11:
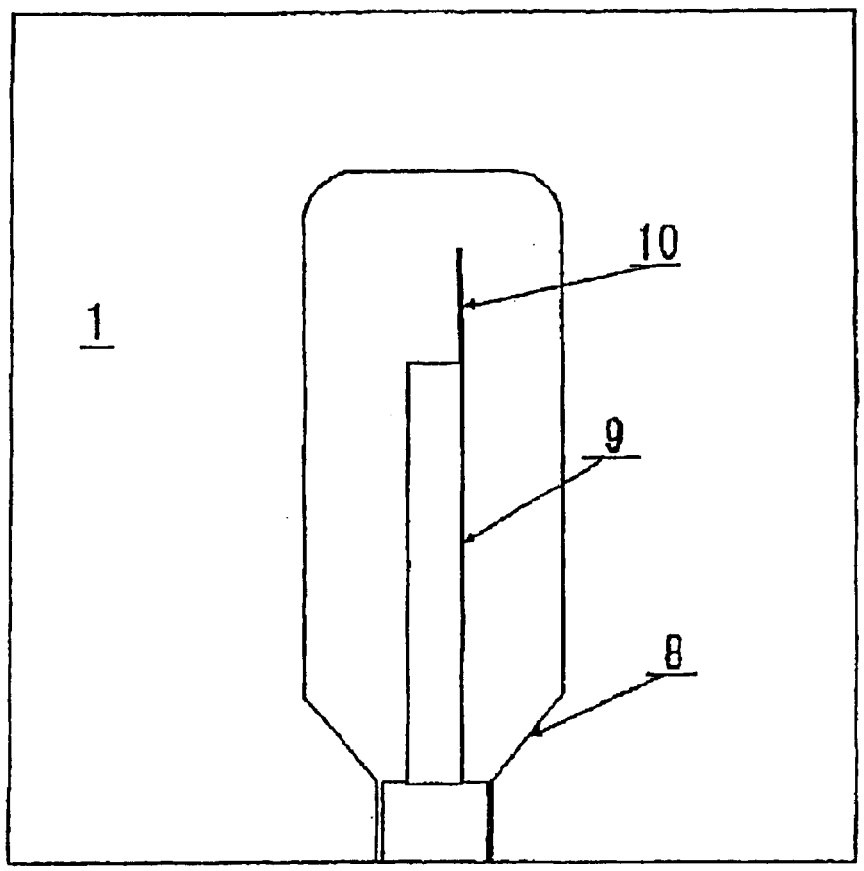
FIG. 11 is a diagram illustrating the arrangement of a plasma processing chamber in the apparatus of FIG. 10.

Referring to FIG. 11 illustrating an arrangement of the plasma treatment chamber 1, a bottle 8 is treated with a plasma in this embodiment. The bottle 8 is held upside down in the plasma treatment chamber. A pipe 9 for introducing the treatment gas is inserted in the bottle 8, and a metallic antenna 10 is extending upward from an end of the introduction pipe 9.

To carry out the treatment with a plasma, the bottle 8 to be treated is, first, mounted on a bottle holder (not shown), the bottle 8 and the bottle holder are maintained air-tight, and the vacuum pump 2 is driven to maintain the interior of the bottle 8 in a vacuum state. Here, to prevent the bottle 8 from being deformed by the external pressure, the plasma treatment chamber 1 surrounding the bottle may also be maintained in a reduced pressure condition.

The degree of reduction of pressure in the bottle 8 achieved by the vacuum pump 2 is such that a glow discharge takes place as the treatment gas is introduced therein and the microwaves are introduced therein. On the other hand, the degree of reduction of pressure in the plasma treatment chamber 1 is such that no glow discharge takes place despite the microwaves are introduced therein.

After the reduced pressure condition is established, the treatment gas is introduced into the bottle 8 through the treatment gas introduction pipe 9, and microwaves are introduced into the plasma treatment chamber 1 through the waveguide 5. At this moment, due to the emission of electrons from the metallic antenna 10, a plasma is stably generated by the glow discharge within very short periods of time.

Here, the treatment gas introduction pipe 9 that is made of a metallic pipe can also serve as a metallic antenna.

It is further allowable to attach a linear or a foil-like metallic antenna to the outer side of the metallic pipe (in a direction in which the pipe is extending), so that the metallic pipe as a whole serves as a metallic antenna.

Further, when a film is to be formed by chemical vapor deposition on the inner surface of the container, it is desired that the treatment gas introduction pipe is made of a porous material such as a porous metal, ceramics or plastics from the standpoint of forming a chemically deposited film featuring homogeneity, small thickness, softness, flexibility and excellent gas shut-off property while enhancing productivity.

The temperature of electrons in the plasma is several tens of thousands of degrees K while the temperature of gaseous particles is several hundreds of degrees K, which is about one-hundredth and is in a thermally non-equilibrium state making it possible to effectively deposit a film even on a plastic substrate having a low heat resistance by the treatment with a plasma.

After the predetermined treatment with the plasma is effected, the treatment gas and microwaves are no longer introduced, a gas is introduced through the exhaust pipe 3 so that the interior and exterior of the container are brought back to normal pressure, and the bottle on which the film is formed by the plasma treatment is taken out from the plasma treatment chamber.

(Plastic Substrate to be Treated)

In the present invention, a variety of plastics can be exemplified as the plastic substrates to be treated.

As the plastics, there can be exemplified polyolefins such as known thermoplastic resins like low-density polyethylene, high-density polyethylene, polypropylene, poly 1-butene, poly 4-methyl-1-pentene or random or block copolymers of α-olefins, like ethylene, propylene, 1-butene, and 4-methyl-1-pentene; ethylene/vinyl compound copolymers such as ethylene/vinyl acetate copolymer, ethylene/vinyl alcohol copolymer and ethylene/vinyl chloride copolymer; styrene resins such as polystyrene, acrylonitrile/styrene copolymer, ABS, and α-methyl styrene/styrene copolymer; polyvinyl compounds such as polyvinyl chloride, polyvinylidene chloride, vinyl chloride/vinylidene chloride copolymer, methyl polyacrylate and methyl polymethacrylate; polyamides such as nylon 6, nylon 6-6, nylon 6-10, nylon 11, and nylon 12; thermoplastic polyesters such as polyethylene terephthalate, polybutylene terephthalate and polyethylene naphthalate; polycarbonate; polyphenylene oxide; biodegradable resins such as polylactic acid; or any resin of the mixture thereof.

These substrates can be used in the form of films or sheets, or can be put to the treatment with a plasma of the invention in the form of containers such as bottles, cups or tubes, or in the form of any other molded articles.

As the bottle concretely described above, there can be exemplified a biaxially drawn blow-molded bottle made of a polyester such as polyethylene terephthalate.

The invention can similarly be applied to the above polyester cups and to the biaxially drawn films, as a matter of course.

The plastic substrate may be a gas barrier multi-layer structure having inner and outer layers of the above thermoplastic resin (desirably an olefin resin) and an oxygen-absorbing layer between these inner layer and outer layer. Upon forming the above silicon oxide film of the invention on the surfaces of the inner layer and/or the outer layer of the multi-layer structure, it is allowed to markedly improve the oxygen barrier property.

The above oxygen-absorbing layer is formed of a resin composition obtained by blending an oxygen barrier resin with an oxidizing polymer and a transition metal catalyst (oxidizing catalyst). That is, in this layer, the oxidizing polymer is oxidized to absorb or trap oxygen and to enhance the oxygen barrier ability of the oxygen barrier resin. The transition metal catalyst is blended to promote the oxidation of the oxidizable polymer.

As the oxygen barrier resin, there can be used known ones. Most desirably, there can be used an ethylene/vinyl alcohol copolymer, such as a saponified copolymer obtained by saponifying an ethylene/vinyl acetate copolymer containing ethylene in an amount of from 20 to 60 mol % and, particularly, from 25 to 50 mol % such that the degree of saponification is not lower than 96% and, particularly, not lower than 99 mol %. The ethylene/vinyl alcohol copolymer (saponified ethylene/vinyl acetate copolymer) should have a molecular weight large enough for forming a film, and should desirably have an intrinsic viscosity of not smaller than 0.01 dl/g and, particularly, not smaller than 0.05 dl/g as measured in a mixed solvent of phenol/water at a weight ratio of 85/15 at 30° C.

Examples of the oxygen barrier resin other than the ethylene/vinyl alcohol copolymer include polyamides such as nylon 6, nylon 6-6, nylon 6/nylon 6-6 copolymer, metaxylylenediadipamide, nylon 6-10, nylon 11, nylon 12 and nylon 13. Among these polyamides, it is desired to use those having amide groups in a number of from 5 to 50 and, particularly, from 6 to 20 per 100 carbon atoms.

These polyamides, too, should have a molecular weight large enough for forming a film and should, desirably, have an intrinsic viscosity of not smaller than 1.1 and, particularly, not smaller than 1.5 as measured in concentrated sulfuric acid (of a concentration of 1.0 g/dl) at 30° C.

As the oxidizable polymer with which the oxygen barrier resin can be blended, there is used a polymer containing an ethylenically unsaturated group. Namely, this polymer has a carbon—carbon double bond which can be easily oxidized with oxygen thereby to absorb and trap oxygen.

The polymer containing the ethylenically unsaturated group is derived by using, for example, polyene as a monomer. Though not limited thereto only, suitable examples of the polyene include conjugated dienes such as butadiene and isoprene; chained nonconjugated dienes such as 1,4-hexadiene, 3-methyl-1,4-hexadiene, 4-methyl-1,4-hexadiene, 5-methyl-1,4-hexadiene, 4,5-dimethyl-1,4-hexadiene and 7-methyl-1,6-octadiene; cyclic nonconjugated dienes such as methyltetrahydroindene, 5-ethylidene-2-norbornene, 5-methylene-2-norbornene, 5-isopropylidene-2-norbornene, 5-vinylidene-2-norbornene, 6-chloromethyl-5-isopropenyl-2-norbornene, and dicyclopentadiene; and trienes and chloroprenes such as 2,3-diisopropylidene-5-norbornene, 2-ethylidene-3-isopropylidene-5-norbornene, and 2-propenyl-2,2-norbornadiene.

Namely, there can be used, as the oxidizing polymer, a homopolymer of the above polyenes, a random copolymer or a block copolymer of a combination of two or more of the above polyenes or of a combination with other monomers. As another monomer to be copolymerized with the polyene, there can be exemplified α-olefins such as ethylene, propylene, 1-butene, 4-methyl-1-pentene, 1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-nonadecene, 1-eicocene, 9-methyl-1-decene, 11-methyl-1-dodecene and 12-ethyl-1-tetradecene. In addition to the above, there can be further exemplified styrene, vinyltriene, acrylonitrile, methacrylonitrile, vinyl acetate, methyl methacrylate and ethyl acrylate.

Among the polymers derived from the above polyenes, it is desired to use polybutadiene (BR), polyisoprene (IR), natural rubber, nitrile/butadiene rubber (NBR), styrene/butadiene rubber (SBR), chloroprene rubber and ethylene/propylene/diene rubber (EPDM) though the polymers are in no way limited thereto only. It is further desired that the iodine value is not smaller than 100 and, particularly, from about 120 to about 196.

It is further allowed to introduce a functional group such as carboxylic acid group or carboxylic anhydride group into the above oxidizing polymer in order to enhance the compatibility between the above oxygen barrier resin and the oxidizing polymer and, hence, to homogeneously disperse the oxidizing polymer in the oxygen barrier resin. The functional group is introduced by graft-copolymerizing, with the oxidizing polymer exemplified above, the α,β-unsaturated carboxylic acid such as acrylic acid, methacrylic acid, maleic acid, fumaric acid, itaconic acid, citraconic acid, tetrahydrophthalic acid, bicyclo[2,2,1]hepto-2-ene-5, 6-dicarboxylic acid, or unsaturated dicarboxylic acid, maleic anhydride, itaconic anhydride, citraconic anhydride, tetrahydrophthalic anhydride or bicyclo[2,2,1]hepto-2-ene-5,6-dicarboxylic anhydride. In these graft copolymers, it is desired that the graft comonomer such as unsaturated carboxylic acid is contained in an amount of from about 0.01 to about 10% by weight so as to be favorably dispersed in the oxygen barrier resin while smoothly absorbing oxygen.

From the standpoint of formability, it is desired that the above oxidizing polymers and the graft copolymers have viscosities over a range of from 1 to 200 Pa·s at 40° C. Further, these oxidizing polymer components are blended in amounts of from 1 to 15 parts by weight and, particularly, from 2 to 10 parts by weight per 100 parts by weight of the oxygen barrier resin.

In a transition metal catalyst used together with the above oxidizing polymer, there can be preferably used, as transition metals, metals of the Group VIII of periodic table, such as iron, cobalt and nickel. However, there can be further used metals of the Group I, such as copper and silver; metals of the Group IV, such as tin, titanium and zirconium; metals of the Group V, such as vanadium; metals of the Group VI, such as chromium; and metals of the Group VII, such as manganese. Among them, cobalt is capable of strikingly promoting the oxygen absorbing ability (oxidation of oxidizing polymer).

The transition metal catalyst is usually used in the form of an inorganic salt, an organic salt or a complex of a low valency of the above transition metal.

As the inorganic salt, there can be exemplified halides such as chlorides, oxysalts of sulfur such as sulfates, oxysalts of nitrogen such as nitrates, oxysalts of phosphor such as phosphates, and silicates.

As the organic salts, there can be exemplified carboxylates, sulfonates and phosphonates. For the object of the invention, however, carboxylates are preferred. Concrete examples include transition metal salts such as of acetic acid, propionic acid, isopropionic acid, butanoic acid, isobutanoic acid, pentanoic acid, hexanoic acid, heptanoic acid, isoheptanoic acid, octanoic acid, 2-ethylhexanoic acid, nonanoic acid, 3,5,5-trimethylhexanoic acid, decanoic acid, neodecanoic acid, undecanoic acid, lauric acid, myristic acid, palmitic acid, margaric acid, stearic acid, arachic acid, linderic acid, tsuzuic acid, petroceric acid, oleic acid, linolic acid, linoleic acid, arachidonic acid, formic acid, oxalic acid, sulfamic acid and naphthenic acid.

As the complex of a transition metal, there can be exemplified a complex with β-diketone or β-keto acid ester. As the β-diketone or β-keto acid ester, there can be used, for example, acetylacetone, ethyl aceto acetate, 1,3-cyclohexadion, methylenebis-1,3-cyclohexadion, 2-benzyl-1,3-cyclohexadion, acetyltetralone, palmitoylteralone, stearoyltetralone, benzoyltetralone, 2-acetylcyclohexanone, 2-benzoylcyclohexanone, 2-acetyl-1,3-cyclohexadion, benzoyl-p-chlorobenzoylmethane, bis(4-methylbenzoyl) methane, bis(2-hydroxybenzoyl)methane, benzoylacetone, tribenzoylmethane, diacetylbenzoylmethane, stearoylbenzoylmethane, palmitoylbenzoylmethane, lauroylbenzoylmethane, dibenzoylmethane, bis(4-chlorobenzoyl)methane, benzoylacetylphenylmethane, stearoyl(4-methoxybenzoyl)methane, butanoylacetone, distearoylmethane, stearoylacetone, bis(cyclohexanoyl)methane and dipivaloylmethane.

It is desired that the above transition metal catalyst is blended in an amount of from 10 to 1000 ppm and, particularly, from 50 to 500 ppm calculated as a metal per the oxygen barrier resin.

(Gas for Forming the Silicon Oxide Film)

The silicon oxide film is formed by using an organosilicon compound as a source of silicon, an oxidizing gas and a carrier gas.

As the organosilicone compound, there can be used organosilane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organosiloxane compounds such as octamethylcyclotetrasiloxane, 1,1,3,3-tetramethyldisiloxane, and hexamethyldisiloxane. In addition to these materials, there can be further used aminosilane and silazane. These organosilicate compounds can be used alone or in a combination of two or more kinds. It is also allowable to use silicon tetrachloride and silane ($SiH_4$) in combination with these organosilicon compounds.

As the oxidizing gas, there can be used oxygen or NOx and as the carrier gas, there can be used argon or helium.

(Treating Conditions)

In the present invention, the conditions for treatment with the plasma are so set that there is formed a silicon oxide film having the two-layer distribution structure that was described above.

The treating conditions include the degree of vacuum, rate of feeding the starting gas, rate of feeding the oxidizing gas, microwave output and discharge output at the time of forming the film. These conditions, however, vary depending upon the size of the plastic substrate (e.g., container) to be treated and other conditions, and cannot be definitely stated. As described above, however, the discharge starts with a low output (e.g., several watts to 150 watt) and is conducted with a large output (e.g., 200 W to 500 W) at the time of forming the film. Other conditions are so set that predetermined IR characteristics, SiOH/SiO ratio, silicon distribution coefficient and surface roughness lie within desired ranges.

It is a general tendency that when the degree of vacuum decreases (pressure increases) during the formation of the film, the first layer having the above IR characteristics is formed little near the interface to the plastic substrate. Even when the rate of feeding the starting silicon gas is too great or too small, the silicon oxide film having the above IR characteristics is formed little.

The conditions for forming the silicon oxide film of the present invention can be determined through experiment by taking the above tendency into consideration.

For instance, the treatment chamber where the treatment with the plasma is to be conducted should be maintained under such a degree of vacuum that a glow discharge takes place. Generally speaking, it is desired that the microwave discharge is conducted while maintaining the pressure for forming the film in a range of from 1 to 200 Pa and, particularly preferably, from 5 to 50 Pa.

The amount of introducing the starting silicon gas (organosilicon compound) varies, as a matter of course, depending upon the surface areas of the plastic substrate to be treated and the kind of the starting gas. When the plastic substrate is a container, however, the starting silicon gas (organosilicon compound) is fed at a flow rate which is as relatively small as from 0.5 to 50 cc/min and, particularly, from 1 to 10 cc/min (hereinafter often simply described as sccm) calculated as starting silicon under the standard condition per one container.

The amount of introducing the oxidizing gas varies depending upon the composition of the starting silicon gas but is desirably fed at a flow rate which is as relatively large as, usually, from 5 to 500 sccm and, particularly, from 10 to 300 sccm.

When the starting silicon is fed at a small rate and the film is formed under a high degree of vacuum (low pressure), the glow discharge based on the microwaves loses stability and, as a result, the formation of the silicon oxide film tends to lose stability.

However, if a metallic antenna is disposed in the plasma treatment chamber in conducting the treatment with the microwave plasma, the glow discharge based on the microwaves becomes stable even when the film is formed under a high degree of vacuum (low pressure), and the silicon oxide film having the above IR absorption characteristics is formed maintaining stability.

In the general glow discharge, small amounts of gaseous ions present in a dark current region are gradually accelerated with an increase in the electrode voltage, come into collision with neutral molecules to ionize them, wherein the newly formed electrons further ionize other molecules, and the cations impinge upon the cathode surface to knock out the electrons. This process is repeated progressively to establish a steady state which the so-called glow discharge where the formation of ions is balanced with the extinction of ions due to diffusion and recombination. The mechanism for generating the glow discharge in the treatment with the microwave plasma is the same as the above mechanism with the exception of introducing the microwaves instead of applying the electrode voltage.

It is considered that stabilizing the glow discharge by installing the antenna according to the invention is intimately related to promoting the glow discharge by emitting electrons. According to the observation by the present inventors, in practice, the antenna disposed in the plasma treatment chamber is heated to a considerably high temperature, implying that thermoelectrons are emitted from the antenna or the electrons are emitted due to cations impinging upon the fine wire.

It will further be comprehended that it is important to keep feeding the oxidizing gas at a large feeding rate in order to maintain the degree of vacuum for forming the film within a suitable range where the glow discharge is stabilized while feeding the starting silicon at a small rate.

In the present invention, the silicon oxide film is formed while maintaining a high degree of vacuum enabling the surface roughness of the silicon oxide film to be confined in a small range, i.e., the 10-point average roughness (Rz) to be smaller than 25 nm and the center line average roughness (Ra) to be smaller than 10 nm.

In order to establish the glow discharge, it is desired that the electromagnetic waves have a frequency of as high as 13.56 MHz or frequencies which are industrially permitted among other microwaves (e.g., in Japan, 2.45 GHz, 5.8 GHz, 22.125 GHz).

The output of the microwaves differs depending upon the surface areas of the substrate to be treated and the kind of the starting gas. As described above, however, the discharge starts with a low output which is then increased at the time of forming the film.

The metallic antenna used for shortening the period of inducing the glow discharge by microwaves, has a length of not shorter than 0.02 times the wavelength ($\lambda$) of microwaves and, most desirably, has a length of $\lambda/4$.

The antenna is of the shape of a fine wire antenna or a foil antenna with its end sharpened and having a length lying within the range described above. The fine wire antenna has a diameter of generally not larger than 2 mm at the end thereof whereas the foil antenna has a width of 5 to 10 mm and a thickness of about 5 to 500 $\mu$m.

The fine wire generates heat and should have excellent heat resistance and is, hence, made of such a material as platinum, stainless steel, copper, carbon, aluminum or steel.

The time for the treatment with the plasma differs depending upon the surface areas of the substrate to be treated, thickness of the film to be formed and the kind of the starting gas, and cannot be definitely stated. When a plastic container is to be treated with the plasma, however, the time for the treatment per a container is not shorter than one second from the standpoint of stably conducting the treatment with the plasma and may, as required, be in the order of minutes though it is desired to shorten the treating time from the viewpoint of cost.

In the case of the plasma CVD, the film is favorably formed by vapor deposition; i.e., the film can be formed on the whole surfaces by vapor deposition.

When the substrate to be treated is a solid molded article such as a plastic container, on the other hand, the interior and/or the exterior of the plastic container is maintained in a reduced pressure atmosphere containing the treatment gas, and the microwave discharge is generated inside and/or outside of the container, so that the film is formed on the inner surface and/or the outer surface of the container by the chemical vapor deposition.

In the plasma treatment method shown in FIGS. 10 and 11, further, the plastic container is held in the plasma treatment chamber, the exterior of the plastic container and the interior of the plastic container are maintained in an air-tight condition, the interior of the plastic container is maintained in a reduced pressure condition in which the microwave discharge takes place in a state where the treatment gas is introduced, the exterior of the plastic container is maintained in a reduced pressure condition where the microwave discharge does not take place in a state where the treatment gas is introduced into the plastic container, and microwaves are introduced to the exterior of the plastic container in the plasma treatment chamber to thereby conduct the treatment with the plasma.

In the case of the solid molded article such as the plastic container, it is desired to place a microwave reflector plate in the plasma treatment chamber in a manner to be faced to the bottom of the plastic container from the standpoint of stabilizing the microwave discharge and enhancing the efficiency of treatment.

Though there is no particular limitation on the thickness of the silicon oxide film of the present invention, it is desired that the thickness is in a range of from 2 to 500 nm and, particularly, from 5 to 300 nm from the standpoint of gas shut-off property an flexibility.

EXAMPLES

The invention will now be described by way of the following Examples to which only, however, the invention is in no sense limited.

In the following Examples and Comparative Examples, the formed films were measured for their properties according to the following methods.

(Measuring the Infrared Absorption Spectrum)
Measurement through the first layer (layer near the interface to the bottle).
(First Infrared Absorption Spectrum)

The drum portion of a PET bottle having the silicon oxide film formed on the inner surface thereof was cut out, aluminum was formed by vapor deposition on the silicon oxide film, the PET was dissolved and removed by using a hexafluoroisopropanol, and the remaining silicon oxide film was put to the infrared spectral analysis by using a one-time reflection apparatus (ATR, material of the prism: germanium, angle of incidence: 45 degrees), FTS 7000 Series manufactured by DIGILAB Co.

Measurement through the second layer (layer on the surface side of the film)
(Second Infrared Absorption Spectrum)

The drum portion of a PET bottle (hereinafter called treated bottle) having the silicon oxide film formed on the inner surface thereof was cut out, and the inner surface of the treated bottle was put to the infrared spectral analysis by using an internal multiple reflection apparatus (ATR, material of the prism: germanium, angle of incidence: 45 degrees), FT-IR (Model, 1600) manufactured by Perkin-Elmer Co.

The untreated bottle was measured for its infrared absorption spectrum relying on a differential spectral method.

There were further found an area ($A_1$) of an absorption peak over the wave numbers of from 1215 to 1250 $cm^{-1}$ and an area ($A_2$) of an absorption peak over the wave numbers of from 980 to 1250 $cm^{-1}$, and Ri was found from $Ri=A_1/A_2 \times 100$.

(Analyzing the Composition of the Film)
The inner surface of the drum portion of the treated bottle was analyzed by using an X-ray photoelectron spectrometer (Scanning ESCA Quantum 2000) manufactured by PHI Co. to find atomic ratios of silicon, oxygen and carbon in the film in the direction of the substrate from the outer surface of the film.

(Measuring the Bonding Energy of Silicon in the Film)
The inner surface of the drum portion of the treated bottle was measured by using an X-ray photoelectron spectrometer (Scanning ESCA Quantum 2000) manufactured by PHI Co. to find a change in the bonding energy of silicon in the film in the direction of the substrate from the outer surface of the film.

(Analyzing $SiCH_3$ and $SiCH_2$ in the Film)
By using a secondary ion mass analyzer (SIMS) manufactured by ULVAC-PHI Co., the amounts of SiO ions, $SiCH_3$ ions and $SiCH_2$ ions were measured in the film from the outer surface thereof in the direction of the substrate to find a relationship between the amount and the depth from the surface of the film.

(Measuring the Amount of Silicon in the Silicon Oxide Film)
The intensity of silicon in the silicon oxide film on the inner surface of the treated bottle was measured by using a fluorescent X-ray spectral analyzer (system 3080) manufactured by Rigaku Co., and the amount of silicon was calculated from a relationship to the known intensity of silicon.

(Measuring the Thickness of the Silicon Oxide Film)
The thickness of the silicon oxide film on the inner surface of the treated bottle was measured by using an ellipsometer (DVA-36L) manufactured by Mizoshiri Kogaku Kogyo Co. assuming that the light absorption coefficient of the film was zero.

(Measuring the Oxygen Gas Permeation Amount)
1. Measurement by Using the Bottles.

The interiors of the treated bottle and of the untreated bottle were substituted with a nitrogen gas, and the mouths of the bottles were sealed with an aluminum foil laminate with a sealant. The bottles were preserved in an environment of 30° C. 80% RH containing 21% of oxygen, and the oxygen gas concentrations in the bottles were measured with the passage of time to find the oxygen gas permeation amounts.

2. Measurement by Using the Films and Sheets.

The oxygen gas permeation amounts were measured by using the treated films and sheets and by using Ox-Tran 2/20 manufactured by Modern Control Co.

(Measuring the Surface Roughness)

The inner surface of the treated bottle was measured for its surface roughness by using an atomic force microscope (tapping mode) manufactured by Digital Instruments Co.

Example 1
(High-Frequency Plasma CVD Device)

This device includes a high-frequency power source having a frequency of 13.56 MHz and a maximum output of 1.5 KW, a metallic ball jar-type treatment chamber having a diameter of 600 mm and a height of 600 mm, and a hydraulic diffusion pump/hydraulic rotation pump for evacuating the treatment chamber. In the treatment chamber are arranged a flat plate high-frequency electrode of a diameter of 120 mm and a flat plate grounding electrode in parallel with each other, the grounding electrode having a mechanism for introducing the reaction gas. A flat plate sample is placed on a sample holder so as to be arranged between the high-frequency electrode and the grounding electrode on the side of the high-frequency electrode.

(Treatment with a High-Frequency Plasma)

A square biaxially drawn polyethylene terephthalate sheet having a side of 120 mm and a thickness of 100 μm was place on a sample holder, and a film was formed under the conditions of feeding a hexamethylenedisiloxane (hereinafter abbreviated as HMDSO) and oxygen as reaction gases at a gas flow rate ratio $HMDSO/O_2$ of 1/10, a vacuum degree of 20 Pa, starting the discharge with a high-frequency output of 50 W which was then increased to 270 W for forming the film and for a period of 7 minutes.

The thus obtained coated PET sheet (hereinafter referred to as PET sheet) was measured for its infrared absorption spectrum of the silicon oxide film from the substrate side in compliance with the above-mentioned method of measuring the infrared absorption spectrum of the first layer. The results were as shown in FIG. 1. As will be obvious from FIG. 1, the silicon oxide film exhibited peaks at 2857 $cm^{-1}$ and 2960 $cm^{-1}$ due to the methyl group and a peak at 2928 $cm^{-1}$ due to the methylene group. Since the peak due to the methylene group is greater than the peak due to the methyl group, it is considered that the film contains the methylene groups in larger amounts than the methyl groups. Absorption due to SiO was also observed over 1000 to 1300 $cm^{-1}$ having a peak at 1215 $cm^{-1}$. That is, it is obvious that the film contains the methyl groups, methylene groups and SiO groups near the interface to the substrate.

Comparative Example 1

The film was formed under the same conditions as in Example 1 but starting the high-frequency discharge with the output of 270 W. The PET sheet was measured for the infrared absorption spectrum of the silicon oxide film from the substrate side in compliance with the above-mentioned method of measuring the infrared absorption spectrum of the first layer. However, the silicon oxide film exhibited no peak in the region of from 2800 to 3000 $cm^{-1}$ but exhibited a peak due to the SiO in the region of from 1000 to 1300 $cm^{-1}$ like in Example 1. Namely, it was obvious that the film of Comparative Example 1 contained no methyl group or methylene group near the interface to the substrate.

(Measuring the Oxygen Permeation Amount Through the Film that is Drawn)

In order to evaluate the adhesive force and flexibility of films in Example 1 and Comparative Example 1, the breakage of films after drawn was evaluated as described below.

The PET sheets treated in Example 1 and Comparative Example 1 were drawn by 1%, 2% and 4% by a monoaxial drawing machine, and were observed for their breakage relying on a method of dying the PET resin with a 1% amino/anthraquinone/ethyl alcohol solution. The results were as shown in Table 1.

TABLE 1

| | Drawing ratio | | | |
|---|---|---|---|---|
| | 0% | 1% | 2% | 4% |
| Example 1 | ○ | ○ | ○ | ○ |
| Comp. Example 1 | ○ | x | x | x |

○: dyed
x: without dyed

Example 2

The PET sheet formed in Example 1 was measured for its amounts of SiO ions, $SiCH_3$ ions and $SiCH_2$ ions from the outer surface of the film in the direction of the substrate according to the above-mentioned method of measuring the amounts of $SiCH_3$ ions and $SiCH_2$ ions in the film. The results were as shown in FIG. 3.

As will be obvious from FIG. 3, neither $SiCH_3$ ion nor $SiCH_2$ ion was found in the surface layer of the film, but $SiCH_3$ ions and $SiCH_2$ ions were existing in the film near the interface to the substrate where the SiO ion concentration decreases. It was therefore obvious that the silicon oxide film possessed a two-layer structure of SiOx layers in which the methyl groups and methylene groups were existing near the interface to the PET substrate but neither the methyl group nor the methylene group was existing in the outer surface layer.

Comparative Example 2

The PET sheet formed in Comparative Example 1 was measured for its amounts of SiO ions, $SiCH_3$ ions and $SiCH_2$ ions from the outer surface of the film in the direction of the substrate according to the above-mentioned method of measuring the amounts of $SiCH_3$ ions and $SiCH_2$ ions in the film. As a result, neither $SiCH_3$ ion nor $SiCH_2$ ion was found in the film near the interface to the substrate where the SiO ion concentration decreases. It was therefore obvious that the silicon oxide film possessed a single-layer structure of SiOx layer in which neither the methyl group nor the methylene group existed near the interface to the PET substrate.

Example 3
(Apparatus for Treatment with a Microwave Plasma)

The apparatus shown in FIG. 10 was used. That is, there were used a microwave oscillator having a frequency of 2.45 GHz and a maximum output of 1.5 KW, a metallic cylindrical plasma treatment chamber having a diameter of 90 mm and a height of 300 mm, a hydraulic rotary vacuum pump for evacuating the treatment chamber and a rectangular waveguide for introducing microwaves into the plasma treatment chamber from the oscillator. In the plasma treatment chamber were installed, as shown in FIG. 11, a bottle holder (not shown), a gas introduction unit, a steel wire-like antenna having a diameter of 0.5 mm, a length of 30 mm and a needle-like end attached to an end of the gas introduction unit, and a hydraulic rotary vacuum pump for evacuating the interior of the bottle.

The gas introduction unit was a cylindrical pipe with bottom made of a metallic sintered material having an outer diameter of 10 mm, a length of 180 mm and pores of a diameter of 120 μm.

(Method of Treatment with a Microwave Plasma)

On the bottle holder was installed a cylindrical bottle of polyethylene terephthalate having a mouth of a diameter of 28 mm, a height of 220 mm and a content of 500 cc, the interior of the treatment chamber was evacuated such that the degree of vacuum on the outside of the bottle was 2 KPa and, further, the vacuum pump was operated until the vacuum degree in the bottle was 2 Pa.

There were introduced 2 sccm of a hexamethyldisiloxane (hereinafter abbreviated as HMDSO), 20 sccm of oxygen and 10 sccm of argon gas while operating the vacuum pump and, further, the vacuum degree in the bottle was adjusted to be 50 Pa by adjusting the valve (not shown).

Electromagnetic waves were generated from the microwave oscillator such that the discharge started with an output of 50 W and the film was formed with an output of 200 W. A plasma was formed in the bottle and the treatment with the plasma was conducted for 10 seconds. The average thickness of film on the treated bottle was 15.7 nm. The barrel portion of the treated bottle was cut out and was used as a sheet (hereinafter referred to as treated sheet).

Comparative Example 3

A treated sheet was prepared by conducting the treatment with a microwave plasma in the same manner as in Example 3 but forming the film with an output of 80 W. The average thickness of the film on the treated sheet was 15.1 nm.

[Measuring the Infrared Absorption Spectrum of the Second Layer]

Figure 6:
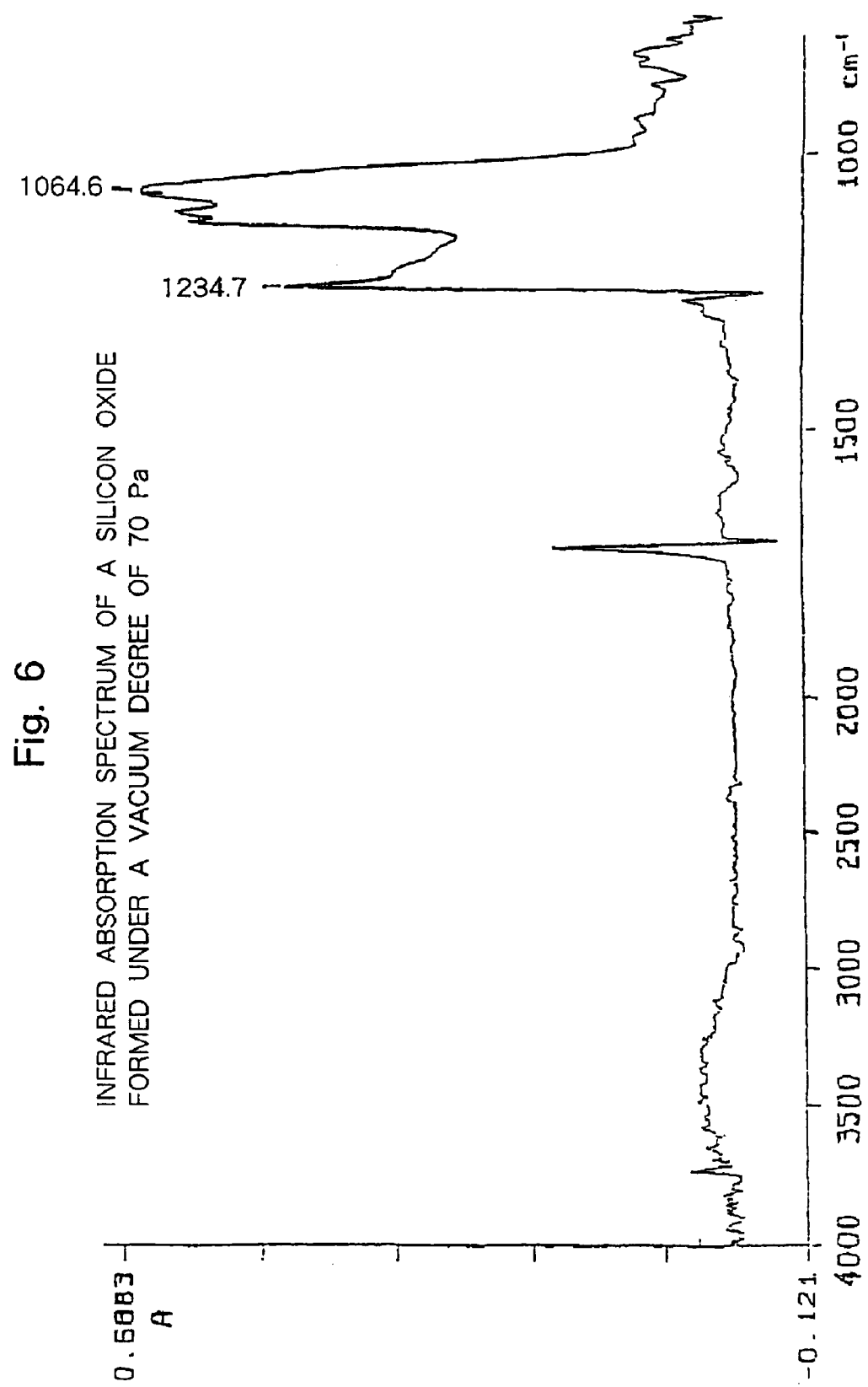
FIG. 6 is a diagram illustrating a second IR spectrum of the silicon oxide film of the invention prepared according to Example 3 as measured from the side of the surface thereof (surface of the side opposite to the interface to the plastic substrate)

The sheets treated in Example 3 and Comparative Example 3 were measured for their infrared absorption spectra of the silicon oxide film from the side of the film surface according to the above-mentioned method of measuring the infrared absorption spectrum of the second layer. As a result, as shown in FIG. 6, the silicon oxide film on the PET sheet of Example 2 exhibited no peak in the region of from 2800 to 3000 cm$^{-1}$ but exhibited a sharp peak at 1238 cm$^{-1}$ as well as a peak at 1067 cm$^{-1}$ due to the SiO group and a peak at 930 cm$^{-1}$ due to the SiOH group. That is, the second layer was formed of a composition containing neither the methyl group nor the methylene group, but containing the SiO group and the SiOH group and having absorption at 1238 cm$^{-1}$. The treated PET bottle was measured for its Ri to be 5.8% according to the above-mentioned method. Further, the ratio SiOH/SiO was 0.15.

Figure 7:
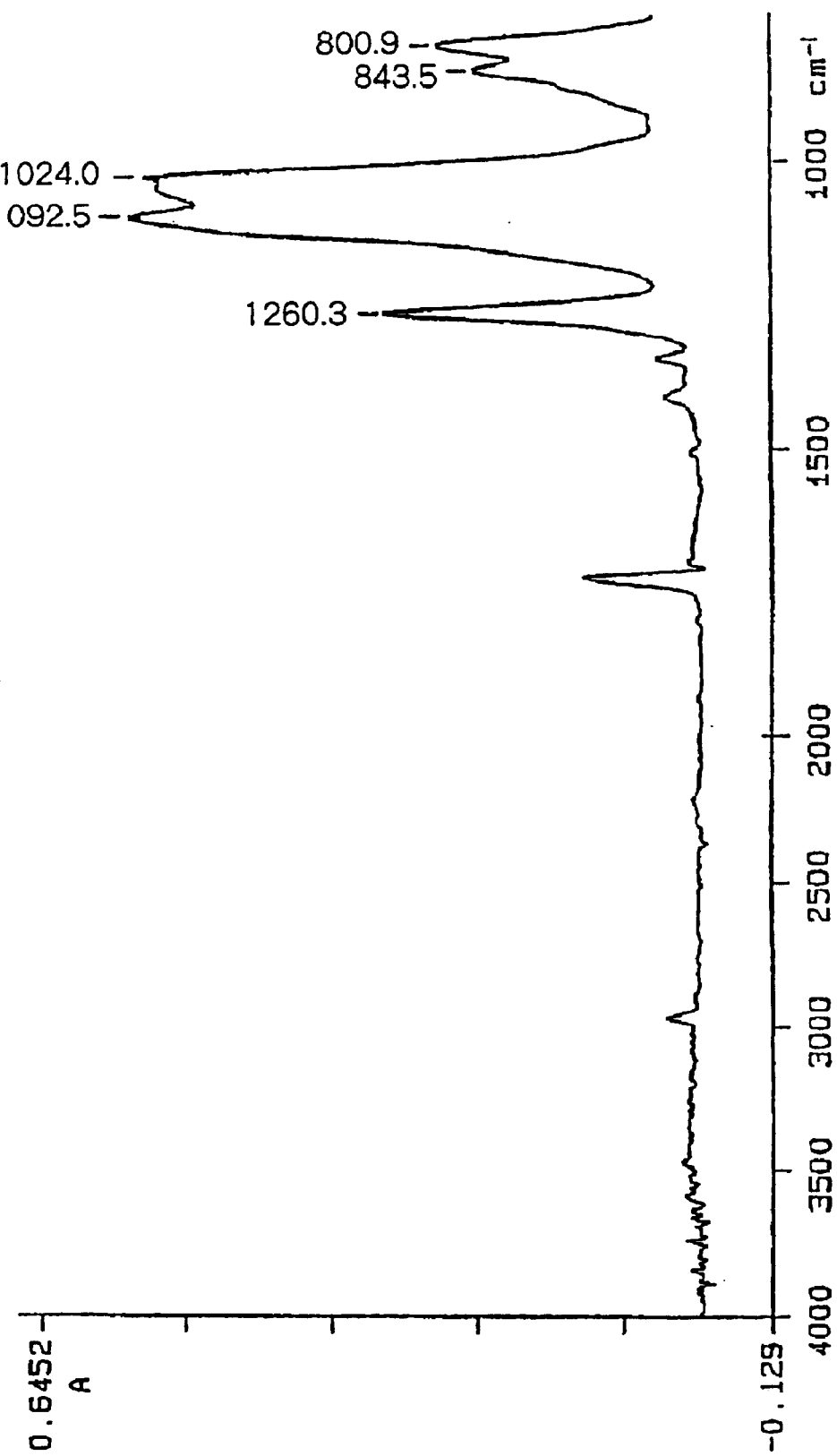
FIG. 7 is a diagram illustrating a second IR spectrum of the silicon oxide film of the invention prepared according to Comparative Example 3 as measured from the side of the surface thereof (surface of the side opposite to the interface to the plastic substrate)

As shown in FIG. 7, on the other hand, the silicon oxide film on the PET sheet treated in Comparative Example 3 exhibited a peak in the region of from 2800 to 3000 cm$^{-1}$ and further exhibited a peak at 844 cm$^{-1}$ due to SiCH$_3$. No sharp peak was found at 1238 cm$^{-1}$. That is, the second layer contained the methyl groups and methylene groups, and possessed Ri of 0%.

(Ri and Oxygen Permeation Amount)
(Experiment 1)

Treated sheets were prepared by using the treating apparatus described in Example 3, the treatment with the microwave plasma was conducted in the same manner but selecting the output for forming the film to be 300 W, 250 W, 170 W and 80 W. The treated sheets were measured for their "Ri"s according to the method described above. Table 2 shows relationships between "Ri"s and the oxygen permeation amounts.

TABLE 2

| Output | Ri of film | O$_2$ permeation amount through treated sheet |
|---|---|---|
| 300 W | 5.4 | 0.09 |
| 250 W | 5.3 | 0.09 |
| 170 W | 4.3 | 0.12 |
| 100 W | 0.5 | 1.12 |
| 80 W | 0 | 1.26 |

O$_2$ permeation amount: cc/m$^2$/day/0.21 atm, at 30° C.

(Infrared Absorbency Ratio (A) of SiOH/SiO)
(Experiment 2)

The treated sheet prepared in Experiment 1 was put to the infrared spectral analysis of the second layer according to the method described above. As a result, the SiCH$_3$ group had not been substantially contained. The treated sheet was further measured for its film thickness, oxygen permeation amount and SiOH/SiO ratio. The relationships between the SiOH amounts in the films and the oxygen permeation amounts were as shown in Table 3 and in FIG. 8. The oxygen permeation amounts were measured by using the bottles.

TABLE 3

| Microwave output (W) | O$_2$ permeation amount (cc/b/day/0.21 atm) 30° C. | SiOH/SiO |
|---|---|---|
| 300 | 0.0033 | 0.13 |
| 250 | 0.0035 | 0.17 |
| 170 | 0.0045 | 0.25 |
| 80 | 0.048 | 0.44 |

(Ratio of the Silicon Content and the Film Thickness)
(Experiment 3)

The treated sheet used in Experiment 1 was measured for its silicon amount according to the method descried above, and the oxygen permeation coefficient of the film was calculated according to the method described above. The results were as shown in Table 4 and FIG. 9.

TABLE 4

| | Si content/thickness of treated sheet | O$_2$ permeation coefficient of the film |
|---|---|---|
| 300 W | 0.5 | 0.05 |
| 250 W | 0.45 | 0.06 |
| 170 W | 0.31 | 0.13 |
| 100 W | 0.18 | 9 |
| 80 W | 0.1 | 13 |

O$_2$ permeation coefficient: cc · cm/cm$^2$/sec/cmHg, at 30° C.
Si content/thickness of the treated sheet: g/cm$^3$ (Surface Roughness and Oxygen Permeation Amount Through the Film)
(Experiment 4)

Treated sheets were prepared by using the treating apparatus described in Example 3, and by conducting the treatment with the microwave plasma in the same manner but selecting the output for forming the film to be 1200 W, 900 W, 300 W and 170 W. The treated sheets were measured for their surface roughness and oxygen permeation amounts according to the method described above. The results were as shown in Table 5.

TABLE 5

|  | Rz of treated sheet (nm) | Ra of treated sheet (nm) | O$_2$ permeation amount through treated sheet |
|---|---|---|---|
| 170 W | 8 | 3.4 | 0.1 |
| 300 W | 12 | 4.7 | 0.08 |
| 600 W | 15 | 6 | 0.09 |
| 900 W | 20 | 8 | 0.12 |
| 1200 W | 30 | 12 | 0.95 |

O$_2$ permeation amount: cc/m$^2$/day/0.21 atm, at 30° C.

What is claimed is:

1. A silicon oxide film formed on the surfaces of a plastic substrate, wherein methyl groups and methylene groups are contained in the silicon oxide film in a portion near the interface to the plastic substrate.

2. A silicon oxide film according to claim 1, wherein an infrared absorption peak due to the methyl group and an infrared absorption peak due to the methylene group in a region of wave numbers of from 2800 to 3000 cm$^{-1}$, are contained in a first infrared absorption spectrum measured for a layer of said silicon oxide film of a portion near the interface to the plastic substrate.

3. A silicon oxide film according to claim 2, wherein an infrared absorption peak due to SiO in a region of wave numbers of from 1000 to 1300 cm$^{-1}$, is contained in said first infrared absorption spectrum.

4. A silicon oxide film according to claim 1, wherein said silicon oxide film has a two-layer structure comprising a first layer positioned on the side of the interface to the plastic substrate and a second layer on the first layer, and the methyl groups and methylene group are more distributed in the first layer than in the second layer.

5. A silicon oxide film according to claim 4, wherein an infrared absorption speak due to SiCH$_3$ at wave numbers of from 845 to 833 cm$^{-1}$, is not substantially contained in a second infrared absorption spectrum measured for the second layer.

6. A silicon oxide film according to claim 5, wherein an absorption peak in a region of wave numbers of from 1215 to 1250 cm$^{-1}$ is contained in said second infrared absorption spectrum.

7. A silicon oxide film according to claim 6, wherein in said second infrared absorption spectrum, the absorbency ratio defined by the following formula (1), $$Ri = A_1/A_2 \times 100 \qquad (1)$$

wherein $A_1$ is an area of an absorbency of wave numbers over a range of from 1215 to 1250 cm$^{-1}$, and $A_2$ is an area of an absorbency of wave numbers over a range of from 985 to 1250 cm$^{-1}$, is not smaller than 1%.

8. A silicon oxide film according to claim 5, wherein in said second infrared absorption spectrum, the infrared absorbency ratio (A) of SiOH/SiO is not larger than 0.25.

9. A silicon oxide film according to claim 5, wherein a silicon distribution coefficient represented by a ratio of the silicon content and the film thickness (silicon content/thickness) is not smaller than 0.3 g/cm$^3$, and an oxygen permeation coefficient is not larger than 0.5×10$^{-16}$ cc·cm/cm$^2$/sec/cmHg (30° C.).

10. A silicon oxide film according to claim 4, wherein a 10-point average surface roughness (Rz) is smaller than 25 nm and a center line average roughness (Ra) is smaller than 10 nm.

11. A silicon oxide film according to claim 1, wherein the thickness of the silicon oxide film is from 2 to 500 nm.

12. A silicon oxide film according to claim 1, wherein the silicon oxide film is formed by a plasma CVD method.

13. A gas shut-off plastic material having an inner layer and an outer layer of a thermoplastic resin, and an oxygen-absorbing layer between the inner layer and the outer layer, wherein a silicon oxide film of claim 1 is formed on the surface of the inner layer and/or on the surface of the outer layer.

* * * * *